(12) United States Patent
Pizzarulli (10) Patent No.: US 7,687,332 B2
(45) Date of Patent: Mar. 30, 2010

(54) SOI CIRCUIT HAVING REDUCED CROSSTALK INTERFERENCE AND A METHOD FOR FORMING THE SAME

(76) Inventor: Andrea Pizzarulli, 734 Live Oak Ave., Menlo Park, CA (US) 94025

( * ) Notice: Subject to any disclaimer, the term of this patent is extended or adjusted under 35 U.S.C. 154(b) by 797 days.

(21) Appl. No.: 11/099,692

(22) Filed: Apr. 6, 2005

(65) Prior Publication Data

US 2005/0260802 A1 Nov. 24, 2005

(30) Foreign Application Priority Data

Apr. 7, 2004 (EP) .................................. 04008436

(51) Int. Cl.
*H01L 21/00* (2006.01)

(52) U.S. Cl. .................. 438/155; 438/460; 257/E21.32; 257/E21.599

(58) Field of Classification Search .................. 438/155, 438/460, 114, 106, 152; 257/E21.32, E21.561, 257/E21.599, E21.546, E21.703
See application file for complete search history.

(56) References Cited

U.S. PATENT DOCUMENTS

| | | | |
|---|---|---|---|
| 5,332,920 A | 7/1994 | Nakagawa et al. | |
| 5,399,507 A | 3/1995 | Sun | |
| 5,610,087 A | 3/1997 | Hsu et al. | |
| 6,037,199 A * | 3/2000 | Huang et al. | 438/166 |
| 6,528,835 B1 * | 3/2003 | Kaeriyama | 257/296 |
| 6,569,729 B1 * | 5/2003 | Wu et al. | 438/219 |
| 6,602,758 B2 * | 8/2003 | Kizilyalli et al. | 438/424 |
| 7,052,939 B2 * | 5/2006 | Huang et al. | 438/146 |
| 7,402,939 B2 * | 7/2008 | Kubota et al. | 313/110 |
| 2003/0122191 A1 * | 7/2003 | Nagano et al. | 257/347 |
| 2003/0153136 A1 | 8/2003 | Matsumoto et al. | |
| 2003/0203546 A1 * | 10/2003 | Burbach et al. | 438/151 |
| 2009/0039457 A1 * | 2/2009 | Xie | 257/508 |

* cited by examiner

*Primary Examiner*—Charles D Garber
*Assistant Examiner*—Stanetta D Isaac
(74) *Attorney, Agent, or Firm*—Perkins Coie LLP (57) ABSTRACT

A method allowing the elimination of crosstalk interference, through the semiconductive substrate, between portions of a circuit provided on a same substrate comprising an upper semiconductive layer and an underlying dielectric layer, for instance an SOI wafer, wherein said portions are separated one from each other by forming trenches on said substrate either down to the dielectric layer or, in the case of an SOI substrate, down to the lower semiconductive layer.

26 Claims, 5 Drawing Sheets

SOI CIRCUIT HAVING REDUCED CROSSTALK INTERFERENCE AND A METHOD FOR FORMING THE SAME

CROSS REFERENCE TO RELATED APPLICATION

This application claims priority under 35 U.S.C. §§119 and/or 365 to application Ser. No. EP 04 008 436.0 filed in the European Community on Apr. 7, 2004, the entire disclosure of which is hereby incorporated by reference.

FIELD OF THE PRESENT INVENTION

The present invention relates to the field of fabrication of integrated circuits, and particularly to the field of fabrication of silicon on insulator (SOI) circuits; in more detail, the present invention relates to a method allowing to reduce and/or eliminate crosstalk interferences between different portions of integrated circuits fabricated on SOI wafers.

BACKGROUND

The need for high performance semiconductor chips has continued to increase over the past several years while, at the same time, the amount of area of the chip has decreased. Moreover, in modern integrated circuits, components having different functions need to be integrated on the same chip; for instance, digital circuits are often needed in combination with analog mix-mode circuits and high sensitive receiving circuits need to be integrated with high power transmitting circuits. However, with ever decreasing feature sizes, the integration on the same chip of components performing differing functions (for instance transmitters and receivers) has been revealed as being a very challenging task. In fact, the performance of a chip or unit comprising different components such as, for example noisy and sensitive components, are strongly affected by the crosstalk interferences arising between these components. Accordingly, a very strong isolation is required between the different components of a chip for the purpose of avoiding and/or reducing crosstalk interference therebetween. When integrated circuits are fabricated on a semiconductive bulk (for instance a silicon layer) according to the standard CMOS and/or BiCMOS technologies, several approaches are used for the purpose of obtaining high isolation between the different components of the chip; along these approaches, the triple well and/or guard rings technologies may be cited. Moreover, when standard CMOS and/or BiCMOS manufacturing processes are used, the need for avoiding and/or reducing interference between the components of the chip is also taken into account at the stage of defining the layout of the chip and multiple voltage sources are provided for different portions of the integrated circuit. However, for central processing units (CPU) operating at clock frequencies of up to 1 GHz and above, the prior art solutions usually adopted in combination with standard bulk CMOS and/or BiCMOS manufacturing processes (triple well, guard rings or the like) have revealed to be not satisfactory, since the isolation between the circuit components obtained by means of these solutions is not sufficient and the performances of the chip are still negatively affected by crosstalk interference arising between these components, in particular between adjacent components.

To overcome this drawback, several solutions have been proposed and developed in the art. In particular, since 1998, the use of silicon-on-insulator (SOI) wafers for fabricating integrated circuits has increased significantly. Among other advantages offered, SOI wafers have the potential to improve the performance of CMOS circuits and have become widely used substrates in the manufacturing of integrated circuits.

Typically, a SOI wafer comprises an upper and a lower layer of silicon and a dielectric layer sandwiched therebetween. The upper layer is sometimes referred to as the active layer, the lower layer is sometimes referred to as the bulk and/or handle layer and the dielectric layer is sometimes referred to as a Buried OXide layer (BOX).

In the art, several approaches are known for forming SOI wafers. Depending on the approach used, different materials are selected for forming the sandwiched dielectric layer. For instance, when silicon-on-sapphire (SOS) wafers are formed, a layer of pure aluminum oxide is sandwiched between two layers of silicon. Alternatively, the separation by implanted oxygen approach and/or the wafer bonding (WB) approach can be used for forming SOI wafers, wherein silicon dioxide is used as the dielectric material.

When building chips on SOI wafers, a transistor of the chip can be isolated from another one by lateral oxide regions and these devices are then interconnected in the conventional way.

There are several advantages offered by the SOI technology. First, circuits fabricated on SOI wafers have reduced parasitic capacitance when compared to bulk wafers that may have an additional epitaxially grown silicon layer. Less capacitance translates into lower power consumption or higher speed. Second, SOI devices have improved radiation-induced single-event upset (SEU) immunity, and they are useful for air and space applications. Thirdly, SOI devices are completely free of latch-up. Moreover, the fabrication process on SOI wafers can be simplified by reducing the number of masks by as much as 30%. Finally, higher performances (in terms of speed) are achievable. In terms of crosstalk, this means extremely good isolation from the substrate noise at transistor level.

However, fabricating semiconductor devices on SOI wafers has several drawbacks. SOI technology is a high cost technology; in particular, this is due to the fact that when SOI wafers are used, processes have to be carried out which are much more expensive than the processes carried out for fabricating semiconductor circuits starting from usual bulk silicon layers. Moreover, SOI wafers are much more expensive than standard bulk silicon layers; in particular, fabricating CMOS circuits on SOI wafers in conformity with SOI fabrication techniques requires that the active silicon layer be thinner than 50 nm. Moreover, the active silicon layer must exhibit very stringent surface uniformity (approximately 10 times the surface uniformity required in the case of standard bulk silicon wafers). Finally, transistors on SOI wafers are affected from the floating body effect; in fact, the lower silicon layer is isolated by the intermediate dielectric layer and cannot be easily connected to the front side of the wafer. However, at least one electrical contact to the lower silicon layer has to be provided since a floating layer under the sandwiched dielectric layer may have an unpredictable impact on the devices fabricated on the wafer during operation.

Accordingly, in view of the problems explained above, it would be desirable to provide a method of forming circuits on SOI wafers that may solve or reduce one or more of the problems identified above. In particular, it would be desirable to provide a method of forming circuits on SOI wafers allowing the fabrication of circuits which, on the one hand, are suitable for medium/high frequency applications and, on the other hand, exhibit high substrate isolation and low crosstalk at low cost.

SUMMARY OF THE INVENTION

In general, the present invention is directed to a method allowing the formation of isolated portions on a substrate so as to reduce the crosstalk interference between those portions of a circuit which are formed on these isolated portions of the substrate. In more detail, the present invention is directed to a method of disposing portions of a circuit on a substrate, wherein said method allows to reduce the crosstalk interference between the circuit portions and to a circuit on a substrate exhibiting very low crosstalk interference.

The present invention is based on the following consideration. Very high performances (in terms of reduced crosstalk interference) may be obtained also in the case of circuits fabricated on a thick silicon layer according to standard bulk CMOS and/or BiCMOS technologies. Accordingly, for all those applications for which standard CMOS and/or BiCMOS fabricating technologies may be preferred to the usual SOI technology (offering very high performances in terms of high speed and/or reduced parasitic capacitance but requiring a very thin active silicon layer and very expensive manufacturing processes) circuits may be fabricated on "non-standard" SOI wafers, namely SOI wafers wherein the active silicon layer has a thickness substantially corresponding to the thickness of a standard bulk silicon layer of the kind used for standard CMOS and/or BiCMOS manufacturing technologies; portions of the circuits can then be separated from each other by removing portions of the thick active silicon layer between those portions of the circuits to be separated, thus reducing crosstalk interference between these circuit portions. Accordingly, expensive manufacturing processes and/or expensive substrates (such as SOI wafers with a very thin active silicon layer) can be avoided but benefit can be taken of the advantages offered by low cost manufacturing technologies, such as bulk CMOS and/or BiCMOS manufacturing technologies.

Accordingly, starting from this teaching, the present invention allows to realize circuits on a thick silicon layer (thicker than the active silicon layer of standard SOI wafers) according to standard manufacturing processes but with these circuits exhibiting very high performances in terms of reduced crosstalk interference. In particular, as it will become more apparent with the following description, circuits exhibiting reduced crosstalk interferences may be realized according to the present invention on a substrate comprising a thick upper layer of a semiconductive material and a layer of a dielectric material below said layer of a semiconductive material.

In particular, according to a first embodiment, the present invention relates to a method of forming at least one isolated portion on a substrate, wherein said substrate comprises an upper layer of a semiconductive material with a first predefined thickness and a layer of dielectric material with a second predefined thickness below said layer of semiconductive material. The method further comprises forming at least one trench on said substrate at least as deep as said first predefined thickness.

According to another embodiment, the present invention relates to a method of disposing at least one circuit on a substrate, wherein said method comprises providing a substrate comprising at least an upper layer of a semiconductive material with a first predefined thickness and a layer of dielectric material with a second predefined thickness below said layer of semiconductive material. The method further comprises providing at least two portions of said at least one circuit on said substrate, wherein at least one portion of said at least one circuit is provided on said layer of semiconductive material and forming at least one trench on said substrate at least as deep as said first predefined thickness so as to reduce interferences between at least one portion and at least one other portion of said circuit.

According to still another embodiment, the present invention relates to a circuit on a substrate, wherein said substrate comprises an upper layer of a semiconductive material with a first predefined thickness and a layer of a dielectric material with a second predefined thickness below said layer of semiconductive material. Said circuit further comprises at least two portions, with at least one portion being provided on said layer of a semiconductive material and said substrate comprises at least one trench at least as deep as said first predefined thickness so as to reduce interferences between at least one first portion and at least one other portion of said circuit.

The present invention has been revealed to be particularly advantageous for those applications where analog-mix mode signal circuits and digital switching circuits have to be monolithically integrated. In particular, the present invention is particularly advantageous in the case of optical transceivers, where transmitters such as laser diode drivers, digital control circuits or the like, and receivers such as highly sensitive trans-impedance amplifiers, limiting amplifiers and clock recovery circuits or the like, have to be monolithically integrated on the same substrate and during the same manufacturing process. Moreover, very relevant advantages are also obtained in those applications where active and/or passive optic (for example Planar Lightwave Circuits) and Optoelectronics Circuitry have to be monolithically integrated; for instance, said Planar Lightwave Circuits may comprise V-grooves for fiber interface, etched mirrors for receiver photodiodes as well as etched areas for laser coupling to the waveguide; the Optoelectronics Circuitry may comprise transimpedance amplifiers, liming amplifiers and/or clock/data recovery, laser diode drivers, analog RF video amplifier. Very high performances in term of reduced crosstalk interference were also obtained in those applications in which both sensitive and noisy circuits are provided on a thick SOI wafer (namely an SOI wafer comprising a thick upper active silicon layer) according to standard CMOS and/or BiCMOS manufacturing technologies.

BRIEF DESCRIPTION OF THE DRAWINGS

Further advantages, objects and embodiments of the present invention are defined in the appended claims and will become more apparent with the following detailed description when taken with reference to the accompanying drawings, in which identical or corresponding parts are identified by the same reference numerals. In particular, in the drawings:

DETAILED DESCRIPTION

While the present invention is described with reference to the embodiments as illustrated in the following detailed description as well as in the drawings, it should be understood that the following detailed description as well as the drawings are not intended to limit the present invention to the particular illustrative embodiments disclosed, but rather the described illustrative embodiments merely exemplify the various aspects of the present invention, the scope of which is defined by the appended claims.

As stated above, the present invention is understood to be particularly advantageous when used for providing circuits or portions thereof on SOI wafers, wherein said SOI wafers comprise an upper active semiconductive layer with a thickness substantially corresponding to the thickness of standard bulk semiconductive layers of the kind used for manufacturing integrated circuits according to standard processes. For this reason, example will be given in the following in which corresponding embodiments of the methods and devices of the present invention are utilized for providing circuits or portions thereof on SOI wafers. However, it has to be noted that the present invention is not limited to the particular case of circuits provided on SOI wafers, but can be used in any other situation in which crosstalk interference between circuits on a substrate and/or between portions thereof is needed. In particular, the present invention is also applicable for providing circuits on a substrate, wherein said substrate does not comprise a lower semiconductive layer but just comprises an upper layer of a semiconductive material and a lower layer of a dielectric material. Moreover, in the embodiments described below, circuits are depicted comprising just two portions to be isolated from each other. It has, however, to be understood that the present invention is also applicable to the cases wherein several portions of a circuit have to be isolated from each other so as to reduce the crosstalk interference therebetween and/or to cases wherein several circuits are provided on the same substrate and isolated from each other. In the examples to be described below, the two circuit portions depicted in the drawings represent a sensitive circuit portion and a noisy circuit portion, respectively. However, the present invention is also applicable to any kind of circuits and/or portions thereof, such as, for example analog-mix mode signal circuits, digital switching circuits, transceivers, transmitters (laser diode drivers, digital control circuits), receivers (highly sensitive trans-impedance amplifiers, limiting amplifiers and clock recovery circuits) or the like.

In FIGS. 1a to 1d, reference 10 relates to an arbitrary section of an SOI wafer, for instance a silicon-on-sapphire (SOS) wafer on which a circuit or portions thereof have to be provided. In particular, in FIGS. 1a to 1d, the SOI wafer is depicted as comprising an upper silicon layer and a lower silicon layer 14 and 12, respectively, as well as a dielectric layer 13 sandwiched therebetween. Reference 20 identifies the substrate formed by said upper silicon layer 14, the lower silicon layer 12 and the dielectric layer 13 sandwiched therebetween. In the following, the dielectric layer will be also referred to as the BOX layer (buried oxide layer). Reference 15 identifies a protective layer, deposited on the substrate 20 and patterned so as to comprise an aperture $15^1$. As it will become more apparent with the following description, the aperture $15^1$ is formed in the protective layer 15 which, for instance, is a resist layer, for the purpose of etching the upper silicon layer 14 so as to form a trench 16 in the substrate 20. References 11s and 11n identify a sensitive portion and a noisy portion of a circuit, respectively, provided on the substrate 20.

Figure 1A:
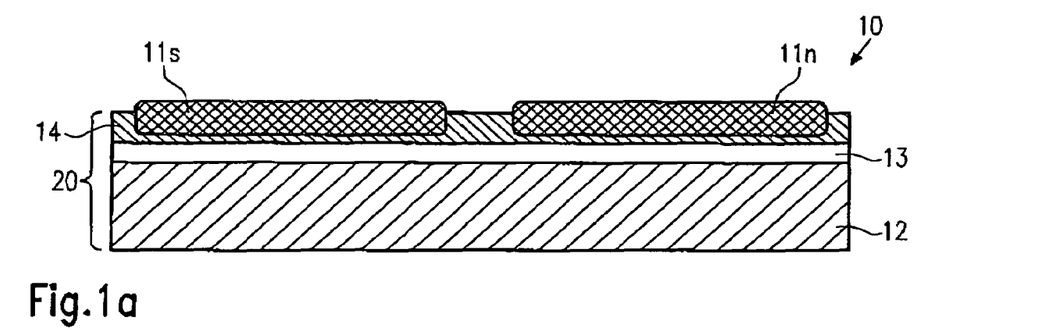
FIGS. 1a to 1d represent a process sequence of a method for providing circuits on a substrate according to a first embodiment of the present invention.

In FIG. 1a, the situation on an SOI wafer 20 is depicted at the moment of the manufacturing process when the circuit portions 11s and 11n have already been provided on the upper silicon layer 14 of the wafer 20. The two circuit portions 11s and 11n may be provided on the semiconductive layer 14 according to any preferred technique among those known in the art, for instance according to well known bulk CMOS and/or BiCMOS manufacturing processes. The way the circuit portions 11s and 11n are formed on the silicon layer 14 is not essential to the present invention and will not be disclosed in more detail, accordingly.

Since both circuit portions 11s and 11n are formed on the upper silicon layer 14, crosstalk interferences may arise between said two circuit portions, affecting the performances of the circuits. Accordingly, the two circuit portions 11s and 11n must be isolated from each other or the crosstalk interference between said two circuit portions must be eliminated or reduced. In particular, as explained in more detail below, this is obtained by forming a trench in the substrate 20 between the two circuit portions 11s and 11n at least down to the sandwiched dielectric layer 13. In other words, a portion of the silicon layer 14 between the two circuit portions 11s and 11n is removed so as to expose at least one portion of the underlying dielectric layer 13.

Figure 1B:
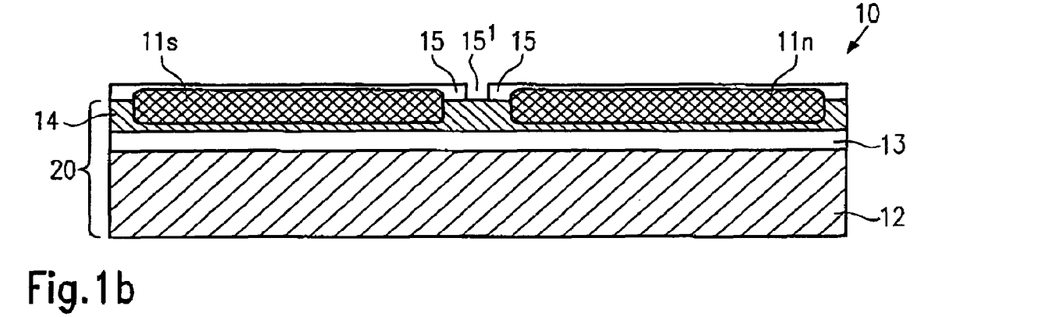

In this way, during a next step as depicted in FIG. 1b, the protective layer 15 is first deposited on the substrate 20 and subsequently patterned so as to form the at least one aperture 151 in said protective layer 15. For example, a photosensitive resist layer may be used as the protective layer 15 and patterned during an exposing and developing step so as to expose that portion of the silicon layer 14 which has to be removed for the purpose of forming a trench in the silicon layer 14.

Figure 1C:
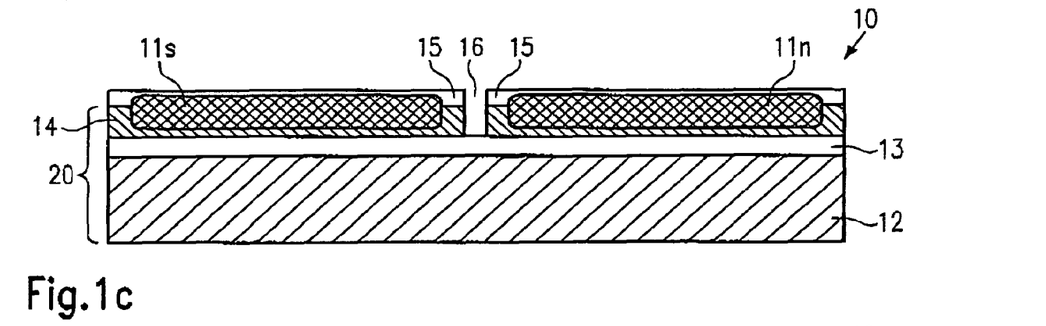

Once the protective layer 15 has been deposited and the aperture $15^1$ has been formed, the silicon in correspondence with said aperture $15^1$ is removed during the next step as depicted in FIG. 1c. For example, a dry anisotropic etching step, well known in the art, can be performed in order to remove the silicon below the aperture $15^1$ in the protective layer 15; alternatively, a wet etching step may be performed for this purpose. As apparent from FIG. 1c, a trench 16 is formed during said etching step, down to the underlying dielectric layer 13, or in other words, at least a portion of said dielectric layer 13 is exposed during said etching step. Alternatively, according to the circumstances, the trench 16 may be deeper than the thickness of the upper silicon layer 14; for instance, the trench 16 may be formed down to the lower silicon layer 12 or, in other words, so as to expose at least a portion of the lower silicon layer 12. For the purpose of avoiding and/or reducing crosstalk interference between the circuit portions 11s and 11n, it is important that the trench 16 be at least as deep as the thickness of the upper silicon layer 14.

Figure 1D:
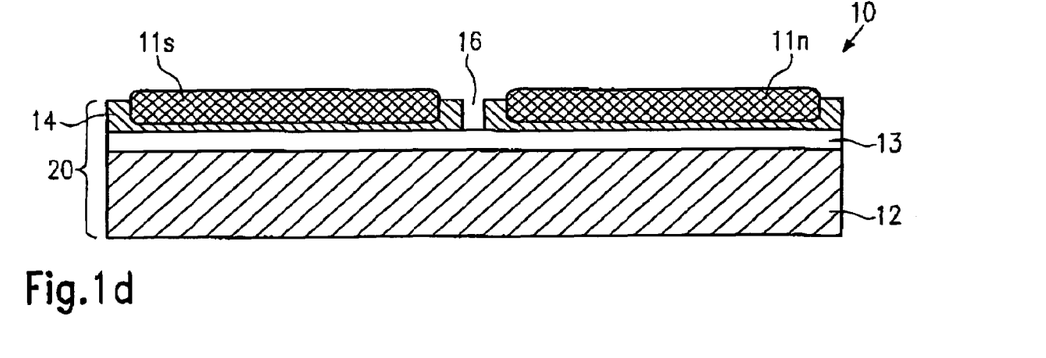

Once the trench 16 has been formed as described above, the protective layer 15 is removed during a further step as depicted in FIG. 1d and the manufacturing process may be prosecuted in the normal way. For instance, a passivation layer of a dielectric material (not depicted in FIG. 1a to 1d) may be deposited on the substrate 20 and planarized during a CMP step (chemical mechanical polishing). Moreover, backside contacts (also not depicted in the figures) may be formed in the substrate 20 for the purpose of connecting the circuit portions 11s and 11n on the upper silicon layer 14 with the lower bulk silicon layer 12.

By means of the trench 16, formed in the substrate 20 at least down to the silicon layer 14, the circuit portions 11s and 11n are isolated from each other so that the crosstalk interferences therebetween are avoided or at least reduced. In other words, isolated portions of the silicon layer 14 have been formed according to the method as disclosed above, on which corresponding portions of the circuit are provided. Since the trench has a depth at least corresponding to the thickness of the silicon layer 14, the circuit portions 11s and 11n are no longer connected by semiconductive material; accordingly, the crosstalk interferences which usually arise between adjacent portions of a circuit provided on a standard bulk silicon layer, is avoided or at least reduced in the present case.

Of course, it will clearly appear to those skilled in the art that the process sequence, as depicted above with reference to FIGS. 1a and 1d, may be changed and/or amended according to the circumstances. For instance, the trench 16 may be formed first (i.e. prior to providing the two circuit portions 11s and 11n on the substrate 20) and the circuit portions 11s and 11n may be provided on the substrate 20 after the trench 16 has been formed. Alternatively, one of the two portions 11s or 11n may be first provided on the substrate 20, i.e. prior to forming the trench 16, and the second portion of the circuit may be provided on the substrate 20 after the trench 16 has been formed.

In the following, a further embodiment of the method according to the present invention, will be described with reference to FIGS. 2a to 2d. In FIGS. 2a to 2d, the features already depicted in FIGS. 1a to 1d are identified by the same reference numerals. Accordingly, in FIGS. 2a to 2d, reference 20 identifies an SOI substrate comprising a thick upper layer 14 and a lower layer 12 of a semiconductive material (for instance silicon or germanium) and a layer 13 sandwiched therebetween of a dielectric material (for instance silicon oxide, aluminum oxide, silicon oxy-nitride or the like). References 11s and 11n represent a sensitive portion and a noisy portion, respectively, of a circuit to be provided on the substrate 20. Finally, references 15 and 16 identify respectively a resist layer and a trench formed in the substrate 20 for the purpose of isolating the circuit portions 11s and 11n from each other. The process sequence depicted in FIGS. 2a to 2d substantially corresponds to the process sequence as described with reference to FIGS. 1a to 1d, with the only difference being that a passivation layer 17 is deposited on the substrate 20 and patterned so as to form at least one aperture 17[1] in said passivation layer 17 for the purpose of etching the substrate 20 so as to form the trench 16.

In the same way as in the case of the process sequence described with reference to FIGS. 1a to 1d, FIG. 2a represents the situation on the SOI substrate 20 at the moment during the manufacturing process when the circuit portions 11s and 11n have already been provided on the substrate but said circuit portions 11s and 11n still need to be isolated from each other so as to avoid or at least reduce crosstalk interference therebetween.

Figure 2A:
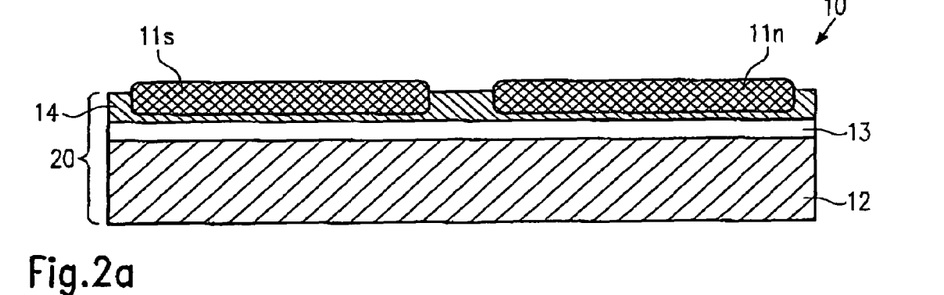
FIGS. 2a to 2d represent a process sequence of a method for providing circuits on a substrate according to another embodiment of the present invention.
Figure 2B:
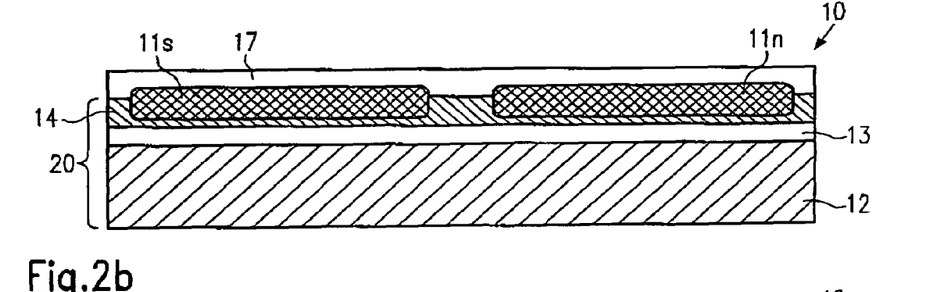
Figure 2C:
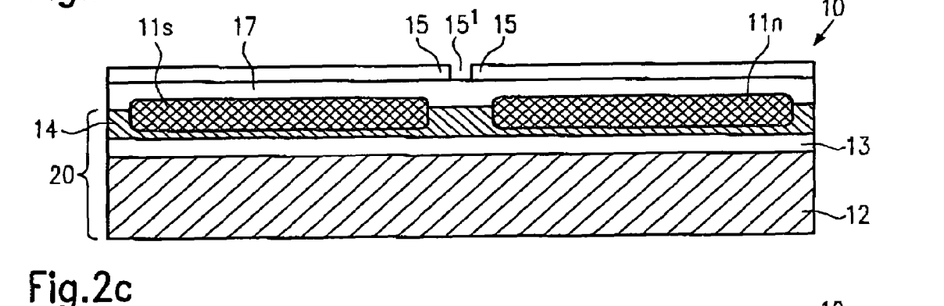

During a next step as depicted in FIG. 2b, the passivation layer 17 is deposited on the substrate 20 according to deposition processes known in the art. For instance, the passivation layer 17 may be first deposited on the substrate as a single layer and subsequently planarized during a CMP planarizing step. Alternatively, the planarization layer 17 may comprise a first thin dielectric layer and a second thicker dielectric layer which is subsequently planarized during said CMP planarizing step. The underlying dielectric layer (not depicted in the figures) may be preferred in those circumstances in which a buried anti-reflective coating is needed for the critical contact hole lithography; said underlying dielectric layer may also be used as an etch stop layer allowing the holes to the polysilicon gate electrodes and the source/drain regions of the transistor (in the case of CMOS transistors) to be etched during a common etching step. Regardless, whether the passivation layer 17 comprises a single or two dielectric layers, the passivation layer 17 is patterned during a next step as depicted in FIG. 2c for the purpose of forming an aperture in said passivation layer 17 between the two circuit portions 11s and 11n. To this end, a resist layer 15 is deposited on the passivation layer 17 (see FIG. 2c) and patterned during an exposing and developing step so as to form the aperture 15l in said resist layer 15 between the two circuit portions 11s and 11n. Once the resist layer 15 has been adequately patterned and the aperture 15[1] has been formed, the passivation layer is etched during an etching step (for instance, a dry-etching step or a wet-etching step) down to the underlying semiconductive layer 14.

Figure 2D:
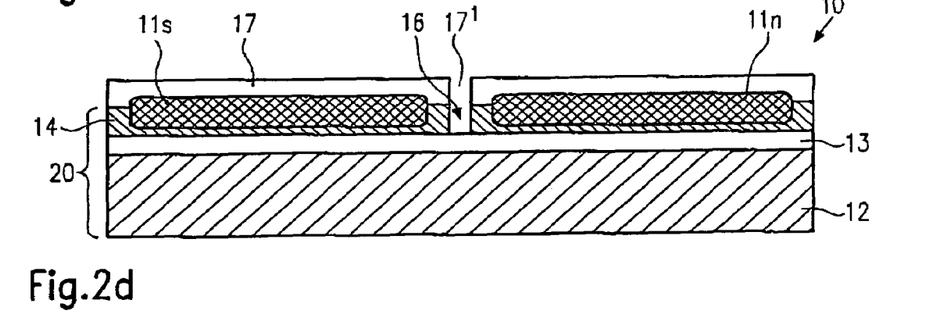

Subsequently, during a final etching step as depicted in FIG. 2d, the substrate 20 is etched (during either a wet-etching step or a dry-etching step) using the patterned passivation layer 17 as a protective mask. According to the present invention, during this etching step, a trench 16 is formed between the two circuit portions 11s and 11n, for the purpose of isolating said circuit portions from each other in order to eliminate or at least reduce crosstalk interferences therebetween. To this end, the trench 16 has to be formed at least as deep as the thickness of the semiconductive layer 14 or, in other words, at least as deep so as to expose a portion of the dielectric layer 13. Also in this case, according to the circumstances, a deeper trench 16 may be formed; for instance, a trench 16 may be formed with a depth corresponding to the total of the thickness of the silicon layer 14 and the dielectric layer 13 or even a deeper trench may be formed.

Once the trench 16 has been formed as described above, the manufacturing processes may be prosecuted as explained with reference to FIGS. 1a to 1d.

Regardless which one of the two process sequences depicted above with reference to FIGS. 1a to 1d and 2a to 2d is carried out, the width of the trench 16 formed on the substrate may be defined according to the circumstances, for instance depending on the integration rate required. For normal circumstances, the width of the trench 16 may be in the range of 5 µm to 20 µm.

Once one or more trenches have been formed on the substrate so as to isolate one or more portions of the circuit on the substrate, the isolated portions may be interconnected during well known wire bonding processes during which metal pads of two or more circuit portions are connected. Alternatively, suspended metallization processes may be carried out to this end. Usually, wire bonding of metal pads is preferred in the case in which isolation trenches are formed during dry-etching steps while suspended metallization processes are preferred in the case in which the isolation trenches are formed during wet etching steps.

Figure 3:
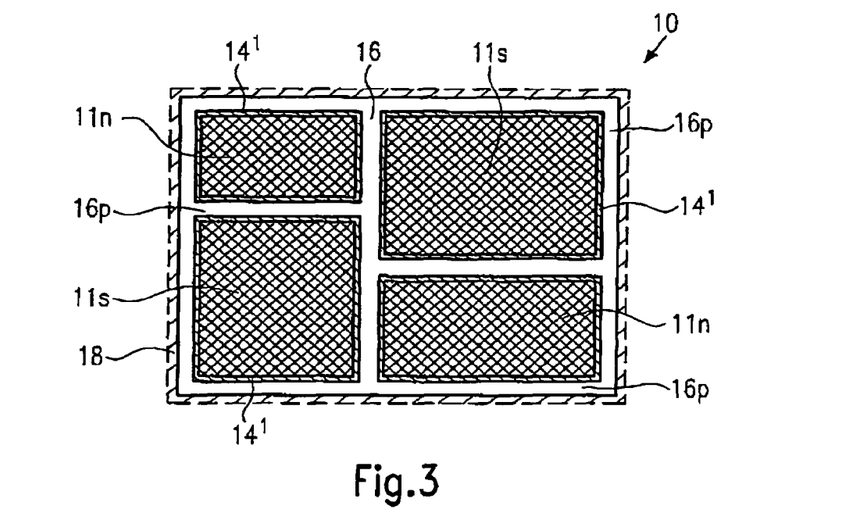
FIG. 3 represents a top view of a substrate on which portions of a circuit on a substrate are isolated with a method according to the present invention.

FIG. 3 represents a top view of the situation on the substrate once isolation trenches 16 have been formed according to one of the process sequences described above with reference to FIGS. 1a to 1d and 2a to 2d, respectively. The circuit depicted in FIG. 3 comprises four circuit portions, namely two sensitive portions 11s and two noisy portions 11n, with each of said four portions being completely isolated from the other portions. However, it will be obvious to those skilled in the art that the method according to the present invention allows the isolation of predefined portions of a circuit from one or more other portions whilst no trenches need to be formed between those portions not affected by crosstalk interferences. In FIG. 3, reference 14[1] identifies the portion of the silicon substrate 14 still remaining around each circuit portion 11n and/or 11s. Moreover, in FIG. 3, reference 16p identifies a trench formed on the substrate all around the circuit or, in other words, in correspondence of the perimeter of the circuit. Although said trench 16p would not be necessary for the purpose of isolating the circuit from other adjacent circuits so as to eliminate or at least reduce crosstalk interferences therebetween, since sawing or cleaving of the wafer for forming single chips would automatically generate isolation, the trench 16p may be formed for the purpose of avoiding damaging and/or breaking of the top silicon layer during sawing or cleaving of the wafer, thus improving the yields during this manufacturing step.

In FIGS. 4a to 4e, a process sequence according to a further embodiment of the method of the present invention is depicted. Again, in FIGS. 4a to 4d, those features already described with reference to previous drawings are identified by the same reference numerals. Accordingly, in FIG. 4a, there is depicted an arbitrary section 10 of a substrate 20 (for instance an SOI wafer) comprising an upper layer 14 and a lower layer 12 of a semiconductive material, for example silicon and/or germanium, and a layer 13 of a dielectric material sandwiched therebetween.

Figure 4A:
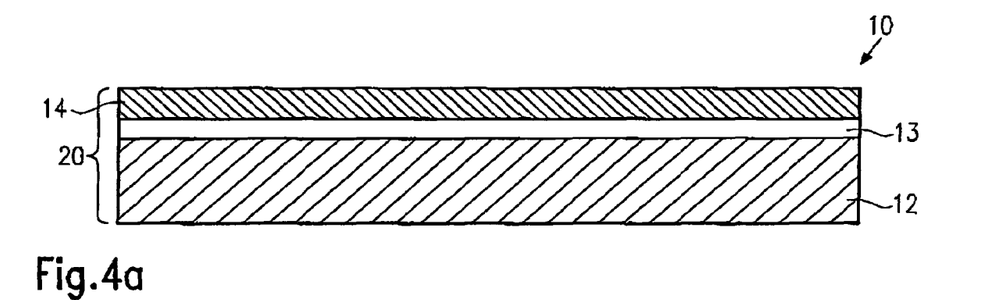
In FIGS. 4a to 4e, a sequence of a method for providing circuits on a substrate according to a further embodiment of the present invention is depicted.
Figure 4B:
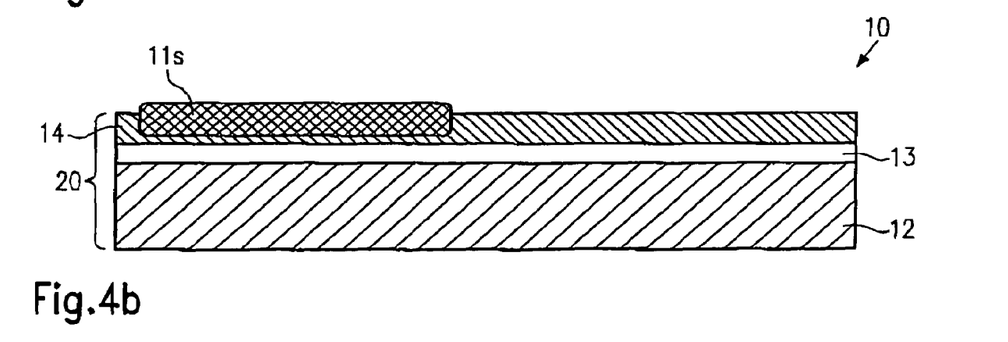

During a first step as depicted in FIG. 4b, a first portion 11s of a circuit is provided on the substrate 20 (on the silicon layer 14) according to well known techniques such as, for example integrated circuits manufacturing processes or the like.

Figure 4C:
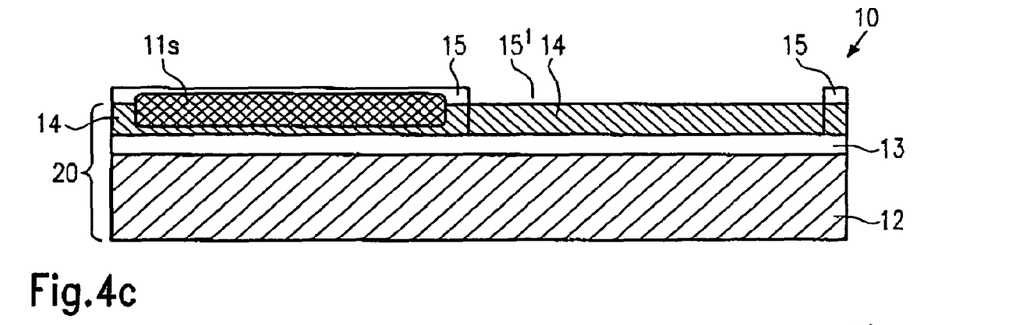

Subsequently, during a next step as depicted in FIG. 4c, a protective layer 15, for instance a resist layer, is deposited on the substrate 20 and patterned so as to form an aperture $15^1$ in said protective layer 15. For instance, patterning the resist layer 15 may comprise exposing and developing the resist layer 15 according to well known masking processes. As apparent from FIG. 4c, forming the aperture $15^1$ allows a corresponding portion of the substrate 20 to be exposed.

Figure 4D:
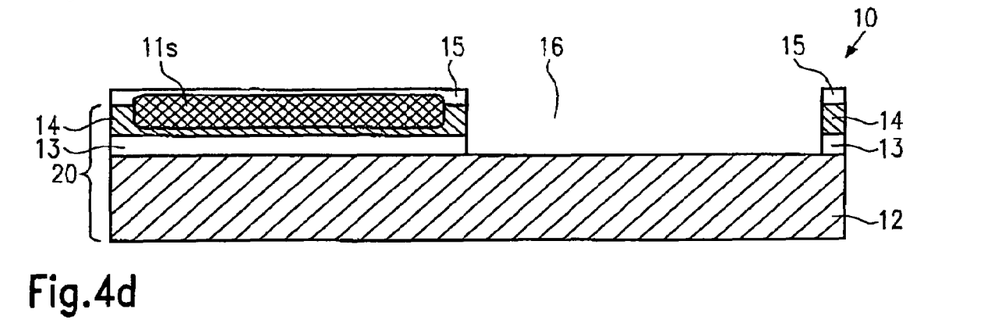

During the next step, as depicted in FIG. 4d, material is removed from the exposed portion of the layer 20. To this end, either a wet or a dry etching step may be performed, during which the patterned resist layer 15, comprising the aperture $15^1$, is used as a protective mask. During said etching step, as depicted in FIG. 4d, a trench 16 is formed on the substrate at least down to the lower semiconductive layer 12. In other words, at the end of the etching step depicted in FIG. 4d, the trench 16 will have a depth corresponding at least to the total of the semiconductive layer 14 and the dielectric layer 13, in combination. Forming the trench 16, as depicted above, allows the elimination or at least the reduction of crosstalk interferences between the circuit portion 11s, already provided on the silicon layer 14, and other portions of the circuit to be provided on the substrate 20 in the trench 16, i.e. on the exposed portion of the lower semiconductive layer 12.

Figure 4E:
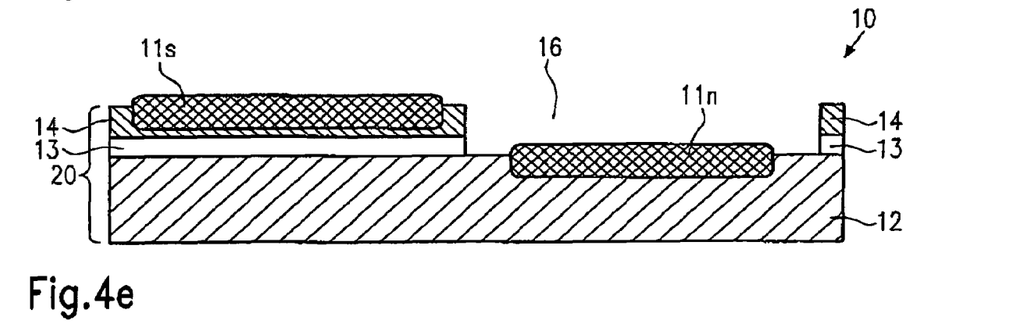

Accordingly, as depicted in FIG. 4e, the process may be prosecuted with the formation of at least one circuit portion 11n on the exposed portion of the semiconductive layer 12 in the trench 16. Since the circuit portions 11s and 11n are separated by the remaining dielectric layer, i.e. the layer below the portion of the semiconductive layer 14 on which the circuit portion 11s has been provided, the two circuit portions 11s and 11n will result in being isolated and no crosstalk interferences will arise between said two circuit portions.

Also in the case of the process sequence as depicted in FIGS. 4a to 4d, the manufacturing process may be prosecuted in the usual way for the purpose of completing the circuit. For example, a passivation layer may be deposited on the circuit and backside contacts may be provided for the purpose of contacting the lower semiconductive layer 12. Moreover, the circuit portions 11s and 11n may be interconnected according to one of the techniques at disposal in the art, for instance by means of wire bonding interconnections and/or suspended metallizations.

Figure 5A:
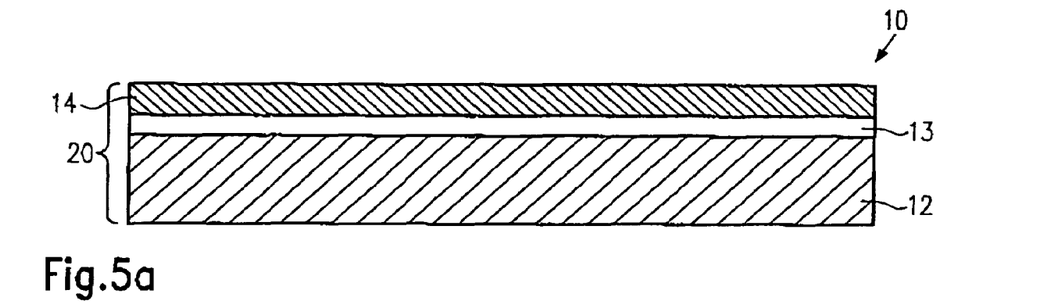
FIGS. 5a to 5d represent a method for providing circuits on a substrate according to still a further embodiment of the present invention.
Figure 5B:
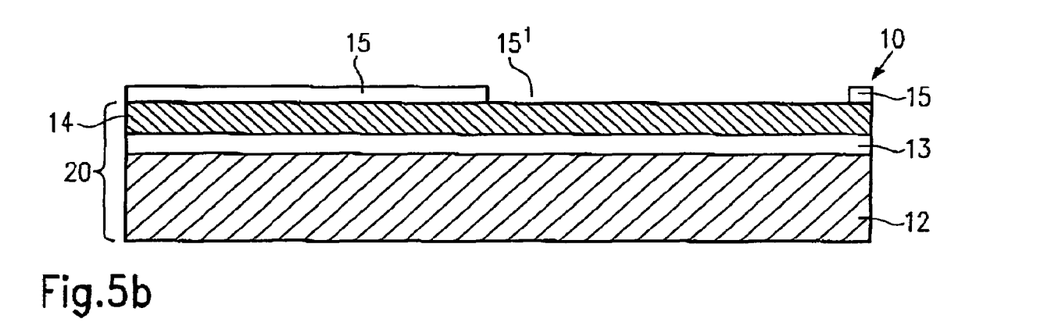

In the following, a further embodiment of the process sequence according to the method of the present invention, will be described with reference to FIG. 5a to 5d. In particular, in FIGS. 5a to 5d, it is shown how the process sequence of FIGS. 4a to 4e may be modified and/or amended. The process sequence depicted in FIGS. 5a to 5d differs from the process sequence depicted in FIGS. 4a to 4e substantially in that, in the sequence depicted in FIGS. 5a to 5d, the trench 16 is formed in the substrate 20 prior to providing the circuit portions 11s and 11n on the substrate 20. In FIGS. 5a to 5d, those features already described with reference to previous figures are identified by the same reference numerals. According to the new process sequence, once a substrate 20 has been provided comprising an upper layer 14 and a lower layer 12 of a semiconductive material (for instance silicon or germanium) and a layer 13 of a dielectric material sandwiched therebetween (see FIG. 5a) at least one trench 16 is formed on said substrate 20, at least down to the under layer 12, i.e. at least as deep so as to expose a portion of said layer 12. To this end, the substrate 20 is masked during a first step as depicted in FIG. 5b with a patterned layer 15, comprising at least one aperture $15^1$. For instance, masking the substrate 20 may comprise depositing a layer 15 of a protective resist on the substrate 20 and patterning said protective resist during an exposing and developing step so as to form the aperture $15^1$.

Figure 5C:
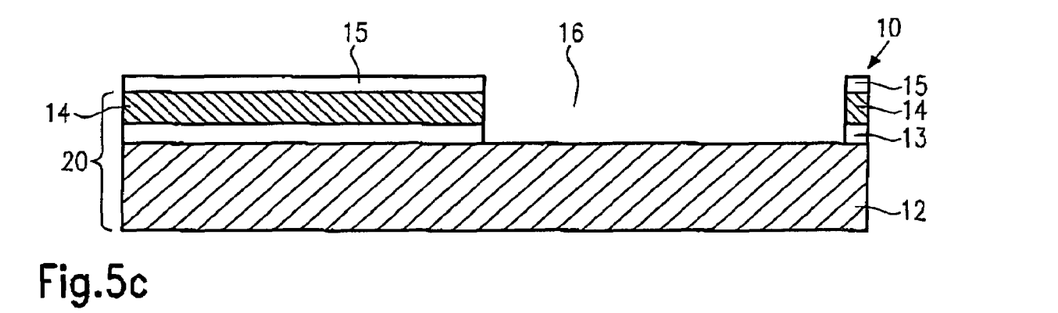

During a next step (see FIG. 5c) the substrate 20, adequately protected by the patterned resist layer 15, is subjected to an etching step (for instance a dry-etching step or a wet-etching step) for the purpose of forming the trench 16. As depicted in FIG. 5c, the trench 16 is at least as deep as the total of the thickness of the semiconductive layer 14 and the intermediate dielectric layer 13. In other words, the etching step depicted in FIG. 5c is prosecuted at least until a portion of the lower semiconductive layer 12 is exposed. It will be apparent to those skilled in the art that the formation of the trench 16 in the substrate 20 results in the formation of two isolated portions on the substrate 20, namely a first portion wherein the substrate 20 still comprises the layers 14 and 12 and the layer 13 sandwiched therebetween and a second portion wherein the substrate 20 no longer comprises the upper layer 14 and the intermediate layer 13 but only the lower layer 12. Accordingly, when circuit portions 11s and 11n are formed on said substrate portions, respectively, said circuit portions will be automatically isolated from each other.

Figure 5D:
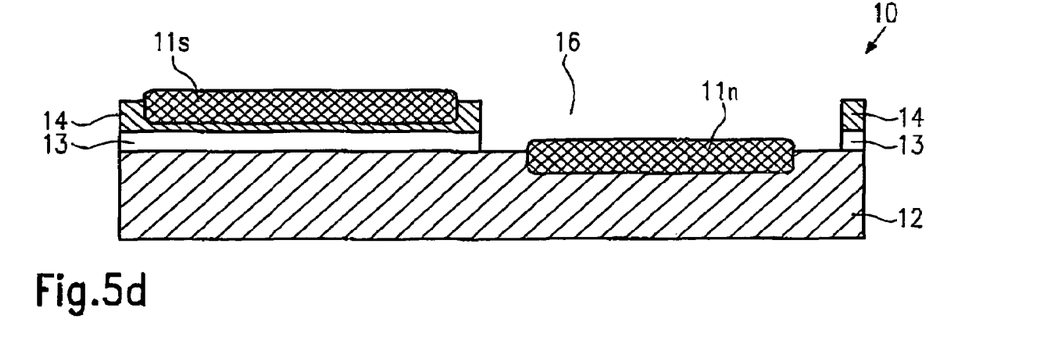

In particular, this can be seen in FIG. 5d, where the next step of the process sequence is depicted, during which a first circuit portion 11s is provided on the semiconductive layer 14 (belonging to the first portion of the substrate) and a second circuit portion 11n is provided in the trench 16 on the semiconductive layer 12 (belonging to the second portion of the substrate). In the same way as in the case of the process sequence as described with reference to FIGS. 4a to 4e, the first and second circuit portions 11s and 11n are separated from each other by the dielectric layer 13 below the remaining portion of the dielectric layer 14 on which the circuit portion 11s has been provided. Accordingly, the performances of the circuit portions 11s and 11n will not be affected by the crosstalk interferences therebetween or at least said crosstalk interferences will be strongly reduced.

Once the circuit portions 11s and 11n have been provided on the substrate as described above, the manufacturing processes may be prosecuted in the usual way; for instance, a passivation layer may be deposited on the substrate 20 and the circuit portions 11s and 11n may be interconnected either by wire bonding or by suspended metallizations. Moreover, according to the circumstances, backside contacts may be formed for the purpose of contacting the lower semiconductive layer 12.

In conclusion, the present invention allows the elimination or at least a great reduction of crosstalk interferences between different portions of circuits provided on a substrate. Moreover, the technique according to the present invention does not show the drawbacks affecting the prior art SOI technology such as, for example high costs arising from very expensive SOI substrates comprising a very thin upper semiconductive layer. On the contrary, the present invention may be carried out using substrates, wherein the upper semiconductive layer has a thickness substantially corresponding to the thickness of usual semiconductive bulk substrates. Furthermore, the present invention may be carried out on substrates comprising only an upper semiconductive layer and an underlying dielectric layer. Furthermore, the present invention may be carried out in combination with standard manufacturing processes for realizing semiconductor devices such as, for example CMOS and/or BiCMOS manufacturing processes.

Of course, it should be understood that a wide range of changes and modifications can be made to the embodiments described above without departing from the scope of the present invention. In particular, the process sequences described above may be mutually combined according to the circumstances. For instance, one or more of the sequences described with reference to FIGS. 4a to 4e and 5a to 5d, respectively, may be combined with one or more of the process sequences described with reference to FIGS. 1a to 1d and 2a to 2d, respectively. Moreover, one or more trenches as depicted in FIGS. 4a to 4e and 5a to 5d, namely trenches going down to the lower semiconductive layer 12 may be formed for the same purpose as the trenches depicted in FIGS. 1a to 1d and 2a to 2d, namely for the purpose of separating adjacent circuit portions. Furthermore, one or more trenches as depicted in FIGS. 1a to 1d and 2a to 2d may be provided on the substrate for the purpose of receiving circuit portions fabricated with technologies other than the technologies for fabricating semiconductor devices. It is, therefore, understood that it is the claims, including all equivalents, which are intended to define the scope of the invention.

What is claimed:

1. A method of manufacturing an integrated circuit including a sensitive portion and a noisy portion, the method comprising:
    forming at least one trench on a substrate at least as deep as a first predefined thickness, wherein the substrate includes:
        an upper layer of a semiconductive material with the first predefined thickness, wherein the upper layer of semiconductive material is thicker than 50 nm and the sensitive and noisy portions are both provided on the upper layer; and
        a layer of a dielectric material with a second predefined thickness, wherein the layer of dielectric material is disposed below the upper layer of semiconductive material, and wherein the at least one trench is formed to isolate the sensitive portion from the noisy portion;
    after said forming the at least one trench, physically separating the substrate into a plurality of chips, wherein one of the plurality of chips includes both the sensitive and noisy portions; and
    after said physically separating the substrate, electrically interconnecting the sensitive portion to the noisy portion.

2. The method of claim 1, wherein the substrate further includes a lower layer of a semiconductive material below the layer of dielectric material, and wherein the at least one trench is formed as deep as a total of the first predefined thickness and the second predefined thickness.

3. The method of claim 1, wherein the first predefined thickness of the upper layer of semiconductive material substantially corresponds to a thickness of a standard bulk semiconductive substrate of a kind used for a standard bulk process of manufacturing integrated circuits.

4. The method of claim 3, wherein the upper layer of semiconductive material has a thickness substantially corresponding to a thickness of a bulk substrate of a kind used in a standard bulk manufacturing CMOS process or a standard bulk manufacturing BiCMOS process.

5. The method of claim 1, wherein said forming at least one trench includes:
    masking the substrate with a protective layer having at least one aperture; and
    etching a portion of the substrate corresponding to the at least one aperture.

6. The method of claim 1, wherein the semiconductive material of the upper layer comprises at least one element selected from the group consisting of Si and Ge.

7. The method of claim 1, wherein each at least one trench has a width in the range of 5-20 µm.

8. The method of claim 1, wherein one or more of the at least one trench is located along a perimeter of one of the plurality of chips, and wherein the substrate is physically separated at the perimeter.

9. A method of manufacturing a chip by using a substrate having an upper layer of a semiconductive material with a first predefined thickness and a layer of a dielectric material with a second predefined thickness, wherein the layer of dielectric material is disposed below the upper layer of semiconductive material, the method of manufacturing comprising:
    providing at least two portions of at least one circuit on the substrate, wherein at least one portion of the at least one circuit is provided on the upper layer of semiconductive material;
    forming at least one trench on the substrate at least as deep as the first predefined thickness, wherein the at least one portion is a sensitive portion and the at least one other portion is a noisy portion;
    after said forming the at least one trench, physically separating the substrate into a plurality of chips, wherein one of the plurality of chips includes both the sensitive and noisy portions; and
    after said physically separating the substrate, electrically interconnecting the sensitive portion to the noisy portion.

10. The method of claim 9, wherein the at least two portions of the at least one circuit are provided on the upper layer of semiconductive material, and wherein the at least one trench is formed between the at least two portions of the at least one circuit.

11. The method of claim 9, wherein the at least one portion of the at least one circuit is provided on the upper layer of semiconductive material prior to said forming the at least one trench on the substrate.

12. The method of claim 9, wherein the at least one portion of the at least one circuit is provided on the upper layer of semiconductive material after said forming the at least one trench on the substrate.

13. The method of claim 9, wherein the substrate further includes a lower layer of a semiconductive material below the layer of dielectric material, and wherein the method further comprises forming the at least one trench on the substrate at least as deep as a total of the first predefined thickness and the second predefined thickness to form at least one exposed portion of the lower layer of semiconductive material.

14. The method of claim 13, wherein the at least one portion of the at least one circuit is provided on the at least one exposed portion of the lower layer of semiconductive material.

15. The method of claim 9, wherein the first predefined thickness of the upper layer of semiconductive material substantially corresponds to a thickness of a standard bulk semiconductive substrate of a kind used for a standard bulk process of manufacturing integrated circuits.

16. The method of claim 15, wherein the upper layer of semiconductive material has a thickness substantially corresponding to a thickness of a bulk substrate of a kind used in a standard bulk manufacturing CMOS process or a standard bulk manufacturing BiCMOS process.

17. The method of claim 9, wherein the upper layer of semiconductive material is thicker than 50 nm.

18. The method of claim 9, wherein said forming at least one trench includes:
    masking the substrate with a protective layer including at least one aperture; and
    etching a portion of the substrate corresponding to the at least one aperture.

19. The method of claim 18, wherein the protective layer includes a passivation layer.

20. The method of claim 9, wherein the semiconductive material of the upper layer comprises at least one element selected from the group consisting of Si and Ge.

21. The method of claim 9, wherein each at least one trench has a width in the range of 5-20 µm.

22. A method of manufacturing a chip by using a substrate having at least one trench formed thereon at least as deep as a first predefined thickness, the substrate having:
    an upper layer of a semiconductive material with the first predefined thickness, wherein a sensitive portion and a noisy portion are provided on the upper layer and the at least one trench has been formed to isolate the sensitive portion from the noisy portion; and
    a layer of a dielectric material with a second predefined thickness, wherein the layer of dielectric material is disposed below the layer of semiconductive material; and
    the method of manufacturing comprising:
    physically separating the substrate into a plurality of chips, wherein one of the plurality of chips includes both the sensitive and noisy portions; and
    after said physically separating the substrate, electrically interconnecting the sensitive portion to the noisy portion.

23. The method of claim 22, wherein the noisy portion is a digital switching circuit and the sensitive portion is an analog-mix mode signal circuit.

24. The method of claim 22, wherein the noisy portion is a transmitter circuit and the sensitive portion is a receiver circuit.

25. The method of claim 22, wherein the sensitive portion comprises one of a trans-impedance amplifier, a limiting amplifier, or a clock recovery circuit.

26. The method of claim 22, wherein the semiconductive material of the upper layer comprises at least one element selected from the group consisting of Si and Ge.

* * * * *